(12) United States Patent
Oh

(10) Patent No.: US 9,935,187 B1
(45) Date of Patent: Apr. 3, 2018

(54) AMBIPOLAR TRANSISTOR AND LEAKAGE CURRENT CUTOFF DEVICE USING THE SAME

(71) Applicant: Teresa Oh, Cheongju-si (KR)

(72) Inventor: Teresa Oh, Cheongju-si (KR)

( * ) Notice: Subject to any disclaimer, the term of this patent is extended or adjusted under 35 U.S.C. 154(b) by 0 days.

(21) Appl. No.: 15/475,483

(22) Filed: Mar. 31, 2017

(51) Int. Cl.
| H01L 29/66 | (2006.01) |
| H01L 29/739 | (2006.01) |
| H01L 29/49 | (2006.01) |
| H01L 27/02 | (2006.01) |
| H01L 29/08 | (2006.01) |
| H01L 29/51 | (2006.01) |

(52) U.S. Cl.
CPC ........ H01L 29/739 (2013.01); H01L 27/0266 (2013.01); H01L 27/0288 (2013.01); H01L 29/0847 (2013.01); H01L 29/4908 (2013.01); H01L 27/0259 (2013.01); H01L 29/51 (2013.01)

(58) Field of Classification Search
CPC ............... H01L 29/739; H01L 27/0288; H01L 27/0266; H01L 29/4908; H01L 29/0847; H01L 27/0259; H01L 29/51
See application file for complete search history.

(56) References Cited

U.S. PATENT DOCUMENTS

| 4,717,944 A | * | 1/1988 | Van de Wiel | ....... H01L 29/0653 257/335 |
| 2015/0221723 A1 | * | 8/2015 | Allibert | ............... H01L 27/0207 257/347 |
| 2016/0013179 A1 | * | 1/2016 | Miura | ................... H01L 23/528 257/401 |
| 2016/0056150 A1 | * | 2/2016 | Nagai | ................ H03K 17/0822 257/76 |
| 2016/0260747 A1 | * | 9/2016 | Cai | ........................ H01L 29/786 |

* cited by examiner

*Primary Examiner* — Victor A Mandala
(74) *Attorney, Agent, or Firm* — Sughrue Mion, PLLC

(57) ABSTRACT

Disclosed are an ambipolar transistor and a leakage current cutoff device using the same. The ambipolar transistor includes: a substrate; a gate formed on the substrate; a gate insulating film formed of an SiOC thin film and disposed on the substrate and the gate; and a source portion and a drain portion formed on the gate insulating film and spaced apart from each other, wherein the source portion and the drain portion comprise: a main source terminal and a main drain terminal disposed on the gate insulating film at right and left sides of the gate, respectively; and a plurality of source sub-terminals and a plurality of drain sub-terminals alternately arranged between the main source terminal and the main drain terminal, respectively.

20 Claims, 7 Drawing Sheets

AMBIPOLAR TRANSISTOR AND LEAKAGE CURRENT CUTOFF DEVICE USING THE SAME

TECHNICAL FIELD

The present invention relates to an ambipolar transistor and a leakage current cutoff device using the same, and more particularly, to an ambipolar transistor which can prevent current leakage using diffusion current having negative resistance characteristics due to a potential barrier caused by dielectrics, an electronic device for blocking leakage current using the same, and a method of fabricating the same.

BACKGROUND

Recently, an electric vehicle market has been gradually expanded. The life of a battery is closely related to the charging method and the discharging phenomenon and thus can be prolonged by removing leakage current.

In an electric vehicle composed of various electronic devices, a leakage current cut-off sensor is an essential component. However, there can actually be problems such as short circuit or over-discharge of a battery, overheating of an LED lamp, generation of sparks, and reduction in lifespan of electronic devices due to electrical instability. These problems can be caused by various factors, but are mainly caused by noise and leakage current.

Conventionally, in order to protect an electronic device by blocking leakage current, a circuit breaker or a constant voltage controller configured to cut off leakage current using a Zener diode when voltage falls below a predetermined voltage is used. However, the above problems can be naturally solved if current leakage can be prevented.

That is, it is possible to avoid overheating, spark generation, and the like by fundamentally preventing current leakage.

In addition, reduction in size of semiconductor devices provides a problem relating to $SiO_2$ thin film dielectrics, such as increase in power consumption due to current leakage, signal interference, and the like, due to limitations of silicon semiconductor technology. Moreover, current leakage provides serious problems in applications including various electronic sensors using semiconductors, displays, smart phones, and batteries.

BRIEF SUMMARY

Some embodiments of the present invention provide a leakage current cutoff device which employs an improved ambipolar transistor configured to generate diffusion current having negative resistance characteristics in order to cutoff leakage current easily generated in batteries, LED lamps, and various electronic devices.

Some embodiments of the present invention provide a transistor capable of providing amplification and control of a diffusion current required to enable a general microprocessor design in order to manufacture electronic devices that operate using a diffusion current alone to cutoff leakage current, and more specifically, a transistor which includes multiple insulating films stacked one above another to increase the diffusion current in order to increase operating current, and a leakage current cutoff device using the same.

In accordance with one embodiment of the present invention, an ambipolar transistor includes: a substrate; a gate formed on the substrate; a gate insulating film formed of an SiOC thin film and disposed on the substrate and the gate; and a source portion and a drain portion formed on the gate insulating film and spaced apart from each other, wherein the source portion and the drain portion include: a main source terminal and a main drain terminal disposed on the gate insulating film at right and left sides of the gate, respectively; and a plurality of source sub-terminals and a plurality of drain sub-terminals alternately arranged between the main source terminal and the main drain terminal, respectively.

The plurality of source sub-terminals and the plurality of drain sub-terminals may be alternately arranged to be separated from each other and connected to each other in series between the main source terminal and the main drain terminal.

The gate insulating film may have an allowable dielectric constant of 0.1 to 2.5.

The gate insulating film may have an allowable leakage current of $10^{-14}$ A to $10^{-10}$ A.

A bias applied to the drain portion may range from $10^{-4}$ V to 1 V.

In accordance with another embodiment of the present invention, an ambipolar transistor includes: a substrate; a gate connected to the substrate; an SiOC insulating film formed on the substrate; an interlayer electrode formed on the SiOC insulating film; an SiOC insulating film formed on the interlayer electrode; and a source portion and a drain portion formed on the SiOC insulating film and spaced apart from each other, wherein the SiOC insulating film and the interlayer electrode are alternately stacked one above another, and wherein the source portion and the drain portion include: a main source terminal and a main drain terminal disposed at right and left sides of the SiOC insulating film, respectively; and a plurality of source sub-terminals and a plurality of drain sub-terminals arranged between the main source terminal and the main drain terminal, respectively.

The gate may be formed in the SiOC insulating film formed on the substrate.

The gate may be formed at an edge of the substrate outside the SiOC insulating film.

The gate may be formed under the substrate.

The plurality of source sub-terminals and the plurality of drain sub-terminals may be alternately arranged to be separated from each other and connected to each other in series between the main source terminal and the main drain terminal.

The gate insulating film may have an allowable dielectric constant of 0.1 to 2.5.

The interlayer electrode may be formed of any one selected from aluminum (Al), nanowire, graphene, ITO, transparent conductive oxide (TCO), AZO, ZTO, IGZO, ZITO, SiZO, hybrid (composite), and CNT-based transparent electrodes.

In accordance with a further embodiment of the present invention, a leakage current cutoff device using an ambipolar transistor includes: a load connected to a drain terminal; a power source connected to the load; a source terminal connected to a negative terminal of the power source; and a gate, wherein leakage current is cutoff by diffusion current between the source terminal and the drain terminal, and the ambipolar transistor comprising the gate electrode, the drain electrode, and the source electrode includes: a substrate; a gate formed on the substrate; a gate insulating film formed of an SiOC thin film and disposed on the substrate and the gate; and a source portion and a drain portion formed on the gate insulating film and spaced apart from each other, wherein the source portion and the drain portion include: a main source terminal and a main drain terminal disposed on the gate insulating film at right and left sides of the gate, respectively; and a plurality of source sub-terminals and a plurality of drain sub-terminals arranged between the main source terminal and the main drain terminal, respectively.

The ambipolar transistor may include: a substrate; a gate connected to the substrate; an SiOC insulating film formed on the substrate; an interlayer electrode formed on the SiOC insulating film; an SiOC insulating film formed on the interlayer electrode; and a source portion and a drain portion formed on the SiOC insulating film and spaced apart from each other, wherein the SiOC insulating film and the interlayer electrode are alternately stacked one above another, and wherein the source portion and the drain portion include: a main source terminal and a main drain terminal disposed at right and left sides of the SiOC insulating film, respectively; and a plurality of source sub-terminals and a plurality of drain sub-terminals arranged between the main source terminal and the main drain terminal, respectively.

The gate may be connected to a power source.

A variable resistor for controlling sensitivity may be connected between the gate and the power source.

A capacitor and a Wheatstone bridge may be connected in parallel to the drain terminal.

According to the present invention, it is possible to provide an ambipolar transistor which can prevent current leakage using negative resistance characteristics, and an electronic apparatus using the same.

According to the present invention, it is possible to provide an ambipolar transistor which can be used in an apparatus for preventing short circuit or over-discharge of a battery due to leakage current, a constant voltage sensor for LED lamps, a leakage current cut-off sensor for electric vehicles, and a leakage current cut-off sensor for smartphone batteries.

According to the present invention, it is possible to provide a transistor which allows design of a nanometer scale circuit while preventing current leakage using diffusion current, thereby enabling detection of signals in the THz range and generating electrical signals.

BRIEF DESCRIPTION OF THE DRAWINGS

The above and other aspects, features and advantages of the present invention will become apparent from the following description of embodiments given in conjunction with the accompanying drawings, in which.

DETAILED DESCRIPTION

Hereinafter, embodiments of the present invention will be described in detail with reference to the accompanying drawings.

The present invention relates to an ambipolar transistor which can generate diffusion current using a negative resistance caused by a potential barrier (negative potential) of a thin insulating film without using a channel layer in order to solve problems caused by current leakage, and a leakage current cutoff device using the same.

A typical transistor has a structure in which a source terminal is separated from a drain terminal by a gate and a gate insulating film and a channel is formed between the source and drain terminals. In addition, change of a current value is mainly controllable by the channel. Thus, in such a transistor, the source terminal and the drain terminal cannot be arranged to have series or parallel connection.

In a transistor without a channel layer, diffusion current is generated by spontaneous polarization caused by a potential difference due to a potential barrier created by a depletion layer or an amorphous insulating film. Dielectrics exhibit spontaneous polarization. Thus, due to transfer characteristics of diffusion current, when a negative (−) voltage is applied to an SiOC insulating film as a gate insulating film, a positive (+) diffusion current flows on the opposite side, and when a positive (+) voltage is applied to the SiOC insulating film, a negative (−) diffusion current flows on the opposite side. Thus, when the SiOC thin film is used as the gate insulating film, it is possible to obtain a transistor capable of exhibiting ambipolar transfer characteristics depending upon the position of the gate.

Such a diffusion current generated due to spontaneous polarization of the dielectrics acts in a direction opposite the direction of a drift current and thus can reduce the internal potential difference. Thus, when the SiOC insulating film is disposed at a metal/semiconductor interface, which can cause increase in resistance due to metal contact, due to spontaneous polarization of dielectrics having a low dielectric constant, a potential barrier caused by the insulating film generates a diffusion current acting in a direction opposite the direction of a drift current, thereby allowing much current to flow through the metal contact by preventing increase in resistance due to metal contact.

Therefore, such a transistor having ambipolar transfer characteristics without current leakage can minimize contact resistance at the interface to allow more diffusion current to flow, thereby increasing efficiency of an electronic device.

Hereinafter, embodiments of a transistor capable of generating diffusion current using a SiOC gate insulating film and a leakage current cutoff device using the same will be described in detail with reference to the accompanying drawings.

Figure 1:
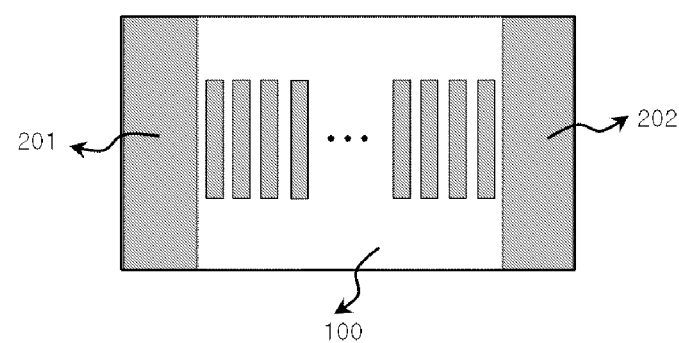
FIG. 1 is a top view of a series pattern diffusion current transistor according to a first embodiment of the present invention.
Figure 2:
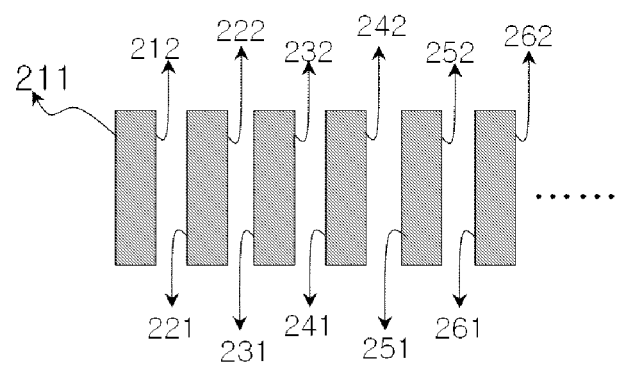
FIG. 2 is a view of a source-drain terminal pattern of the series pattern diffusion current transistor of FIG. 1.
Figure 3:
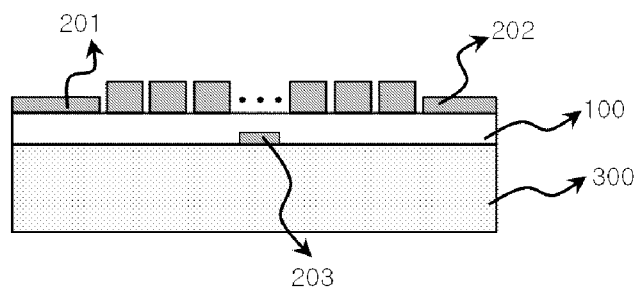
FIG. 3 is a sectional view of the series pattern diffusion current transistor of FIG. 1.

FIG. 1 is a top view of a series pattern diffusion current transistor according to a first embodiment of the present invention, FIG. 2 is a view of a source-drain terminal pattern of the series pattern diffusion current transistor of FIG. 1, and FIG. 3 is a sectional view of the series pattern diffusion current transistor of FIG. 1.

Referring to FIGS. 1 to 3, an ambipolar transistor using diffusion current according to a first embodiment of the present invention includes: a gate 203 formed on a substrate 300; a gate insulating film 100 formed on the substrate 300 and the gate 203 and formed of a SiOC thin film; and a source portion and a drain portion formed on the gate insulating layer 100 and spaced apart from each other.

In addition, when drain and source signal lines are disposed on the gate insulating film 100, in order to amplify electrical signals (voltage) while increasing sensitivity, the source portion and the drain portion may include: a main source terminal 202 and a main drain terminal 201; and a plurality of source sub-terminals and a plurality of drain sub-terminals, respectively, wherein the plurality of source sub-terminals 212, 222, 232, . . . and the plurality of drain sub-terminals 211, 221, 231, . . . are each formed of a metal wire and are alternately arranged to be connected to each other in series.

The transistor according to the present invention has a structure in which the main source terminal 202 and the main drain terminal 201 are stacked on the gate insulating film 100 without a channel layer, unlike a typical transistor having a channel layer. Here, the gate insulating film 100 is formed of a SiOC thin film and preferably has a dielectric constant of 1.0 to 2.5.

Further, in order for an electronic sensor fabricated using the transistor to have high sensitivity, the gate insulating film 100 has a leakage current of $10^{-14}$ A to $10^{-10}$ A and is required to be amorphous instead of exhibiting polarization.

The SiOC thin film used as the gate insulating film of the transistor according to the present invention may be formed by a process in which an SiOC target is deposited by sputtering, ICP-CVD, or PE-CVD, followed by heat treatment.

In order to reduce polarization of the SiOC film, that is, to inhibit increase in polarization due to carbon and oxygen, the carbon content is controlled. When the carbon content of the SiOC target is 0.1% or less, it is difficult to form the SiOC thin film. Preferably, the carbon content of the SiOC target ranges from 0.05% to 15% so as to restrict the dielectric constant of the gate insulating film 100 to a range of 1.0 to 2.5.

Figure 4:
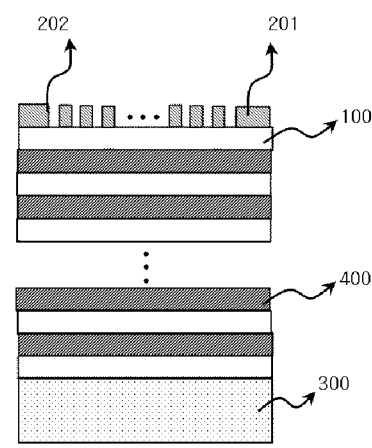
FIG. 4 is a sectional view of a series pattern diffusion current transistor according to a second embodiment of the present invention.
Figure 5:
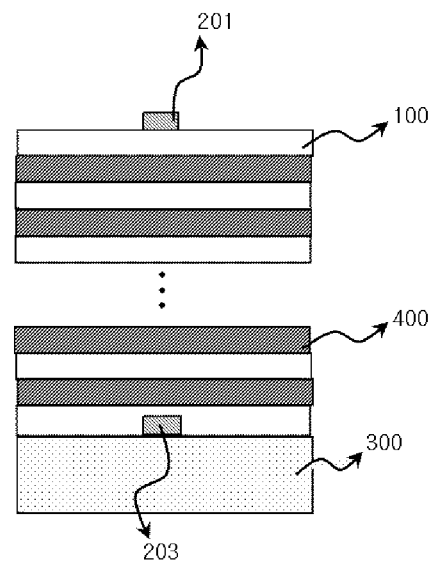
FIG. 5 is a sectional view of a series pattern diffusion current transistor according to a third embodiment of the present invention.
Figure 6:
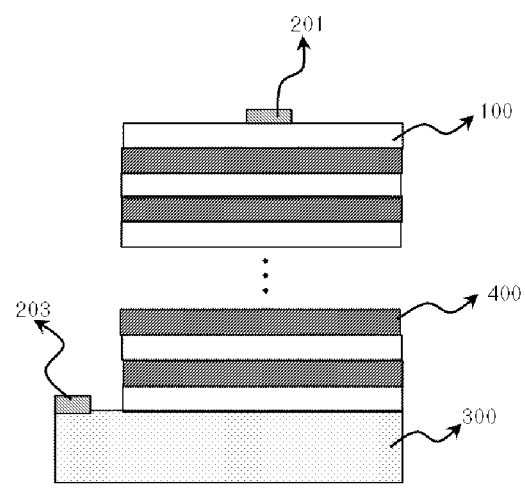
FIG. 6 is a sectional view of a series pattern diffusion current transistor according to a fourth embodiment of the present invention.
Figure 7:
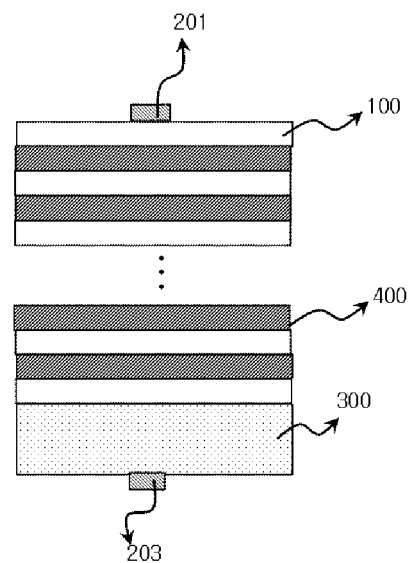
FIG. 7 is a sectional view of a series pattern diffusion current transistor according to a fifth embodiment of the present invention.

FIG. 4 is a sectional view of a series pattern diffusion current transistor according to a second embodiment of the present invention, FIG. 5 is a sectional view of a series pattern diffusion current transistor according to a third embodiment of the present invention, FIG. 6 is a sectional view of a series pattern diffusion current transistor according to a fourth embodiment of the present invention, and FIG. 7 is a sectional view of a series pattern diffusion current transistor according to a fifth embodiment of the present invention.

An ambipolar transistor using diffusion current according to a second embodiment of the present invention includes a gate 203 connected to a substrate 300, an interlayer electrode 400 formed on the substrate 300, an SiOC insulating film 100 formed on the interlayer electrode 400, and a source portion and a drain portion formed on the interlayer electrode and spaced apart from each other, wherein the interlayer electrode and the SiOC insulating film 100 include a plurality of interlayer electrodes and a plurality of SiOC insulating films alternately stacked one above another, respectively.

In addition, the source portion and the drain portion include: a main source terminal 202 and a main drain terminal 201 disposed at right and left sides of the SiOC insulating film 100, respectively; and a plurality of source sub-terminals and a plurality of drain sub-terminals, respectively, wherein the plurality of source sub-terminals 212, 222, 232, . . . and the plurality of drain sub-terminals 211, 221, 231, . . . are each formed of a metal wire and are alternately arranged to be connected to each other in series.

As in the first embodiment, the SiOC thin film 100 preferably has a dielectric constant of 1.0 to 2.5 and a leakage current of $10^{-14}$ A to $10^{-10}$ A, and is required to be amorphous instead of exhibiting polarization.

FIG. 5 is a sectional view of a series pattern diffusion current transistor according to a third embodiment of the present invention. In this embodiment, the gate is formed in the SiOC insulating film 100 on the substrate.

FIG. 6 is a sectional view of a series pattern diffusion current transistor according to a fourth embodiment of the present invention. In this embodiment, the gate is formed at an edge of the substrate outside the SiOC insulating film.

FIG. 7 is a sectional view of a series pattern diffusion current transistor according to a fifth embodiment of the present invention. In this embodiment, the gate is formed under the substrate.

In the ambipolar diffusion current transistors according to the second to fifth embodiments, the interlayer electrode 400 may be form of any one selected from aluminum (Al), nanowire, graphene, ITO, transparent conductive oxide (TCO), AZO, ZTO, IGZO, ZITO, SiZO, hybrid (composite), and CNT-based transparent electrodes.

In the ambipolar diffusion current transistors according to the second to fifth embodiments, the interlayer electrode 400 is stacked on the substrate 300, the SiOC insulating film 100 is stacked on the interlayer electrode, and the plurality of source terminals and the plurality of drain terminals are alternately arranged to be connected to each other in series between the main drain terminal 201 and the main source terminal 202.

Figure 8:
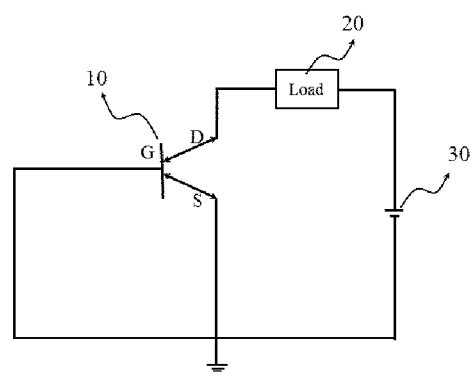
FIG. 8 is a DC circuit diagram of a leakage current cutoff device using the ambipolar transistor according to the embodiments of the present invention.

FIG. 8 is a DC circuit diagram of a leakage current cutoff device using the ambipolar transistor according to the embodiments of the present invention.

Referring to FIG. 8, the leakage current cutoff device using the ambipolar transistor includes: a load 20 connected to a drain terminal D; a power source 30 connected to the load 20; a source terminal S connected to a (−) terminal of the power source; and a gate G, and can prevent current leakage using diffusion current between the source terminal S and the drain terminal D using diffusion current. Here, the ambipolar transistor 10 including the gate, the drain terminal, and the source terminal may be any one of the ambipolar transistors as shown in FIGS. 1 to 7.

An electronic sensor using the ambipolar transistor according to the first embodiment as shown in FIG. 1 includes: a gate 203 formed on a substrate 300; a gate insulating film 100 formed on the substrate 300 and the gate and formed of a SiOC thin film; and a source portion and a drain portion formed on the gate insulating film 100 and spaced apart from each other.

When drain and source signal lines are disposed on the gate insulating film 100, in order to amplify electrical signals (voltage) while increasing sensitivity, the source portion and the drain portion may include: a main source terminal 202 and a main drain terminal 201; and a plurality of source sub-terminals and a plurality of drain sub-terminals, respectively, wherein the plurality of source sub-terminals 212, 222, 232, . . . and the plurality of drain sub-terminals 211, 221, 231, . . . are alternately arranged to be connected to each other in series.

An electronic sensor using the ambipolar transistor according to the second embodiment as shown in FIG. 2 includes: a gate 203 connected to a substrate 300; an interlayer electrode 400 formed on the substrate; an SiOC insulating film 100 formed on the interlayer electrode 400; and a source portion and a drain portion formed on the SiOC insulating film and spaced apart from each other, wherein the interlayer electrode and the SiOC insulating film 100 include a plurality of interlayer electrodes and a plurality of SiOC insulating films alternately stacked one above another, respectively.

In addition, the source portion and the drain portion include: a main source terminal 202 and a main drain terminal 201 disposed at right and left sides of the SiOC insulating film 100, respectively; and a plurality of source sub-terminals and a plurality of drain sub-terminals, respectively, wherein the plurality of source sub-terminals 212, 222, 232, . . . and the plurality of drain sub-terminals 211, 221, 231, . . . are each formed of a metal wire and are alternately arranged to be connected to each other in series.

FIG. 8 is a circuit diagram illustrating an application of leakage current cutoff using an ambipolar transistor, which uses a diffusion current flowing through dielectrics.

Referring to FIG. 8, when series connection is established at a portion where leakage current flows, a drift current entering an input terminal S changes into a diffusion current during passage through the transistor according to the first embodiment, thereby eliminating the leakage current. The diffusion current is converted into a drift current again at an output terminal D such that electricity is conducted. As temperature increases, a potential barrier becomes higher, thereby causing increase in resistance while decreasing the current, whereby the ambipolar transistor can be used as a constant voltage sensor. In order to increase capacity, the diffusion current may be amplified by vertically stacking the insulating layers or by alternately arranging multiple source and drain terminals.

Figure 9:
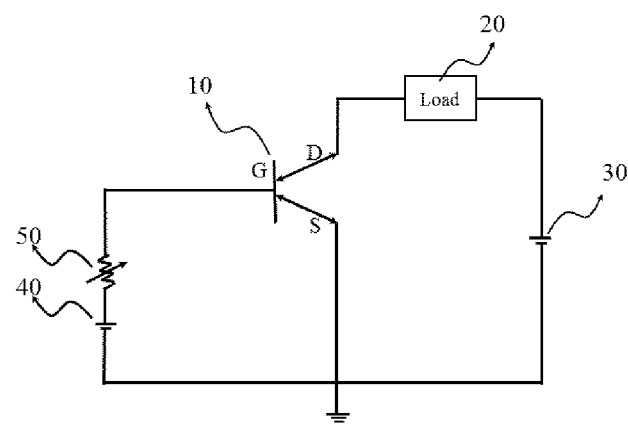
FIG. 9 is a circuit diagram in which a variable resistor 50 and a power source 40 are further connected to the gate of FIG. 8.

FIG. 9 is a circuit diagram in which a variable resistor 50 and a power source 40 are further connected to the gate of FIG. 8. Here, the variable resistor 50 is connected between the gate G and the power source 50 to control sensitivity.

In this embodiment, a diffusion current at the gate is affected by gate voltage and gate resistance, and a signal current is converted into a diffusion current between the source terminal and the drain terminal. The amount of diffusion current flowing between the source terminal and the drain terminal can be controlled by the gate.

Figure 10:
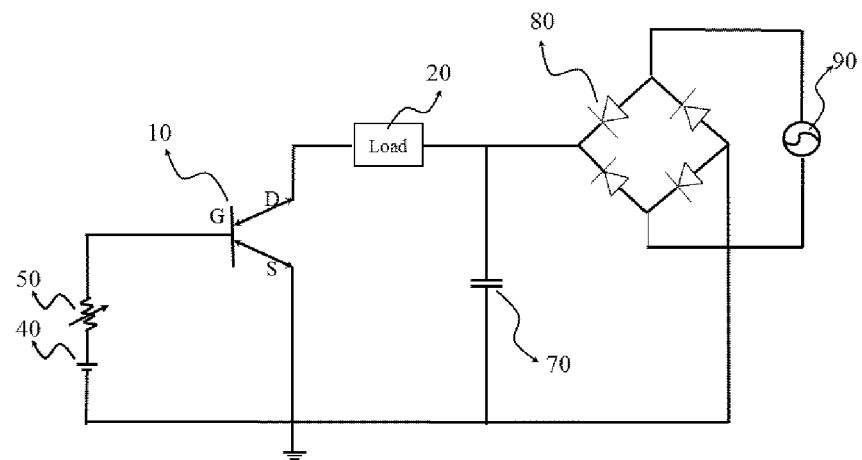
FIG. 10 is an AC circuit diagram of a leakage current cutoff device using the ambipolar transistor according to the embodiments of the present invention.

FIG. 10 is an AC circuit diagram of a leakage current cutoff device using the ambipolar transistor according to the embodiments of the present invention.

Referring to FIG. 10, in the leakage current cutoff device according to this embodiment, an AC power source 90 including a Wheatstone bridge is connected to the drain terminal of FIG. 9, and a capacitor 70 and the Wheatstone bridge 80 are connected in parallel to the drain terminal.

The circuit diagram of FIG. 10 is a circuit diagram for design of typical embedded circuits or for use in high-power applications. In this embodiment, even when a high voltage is applied, a sensor can be driven by a diffusion current generated therein to prevent overvoltage and current leakage, thereby increasing lifespan of an electronic device.

Figure 11:
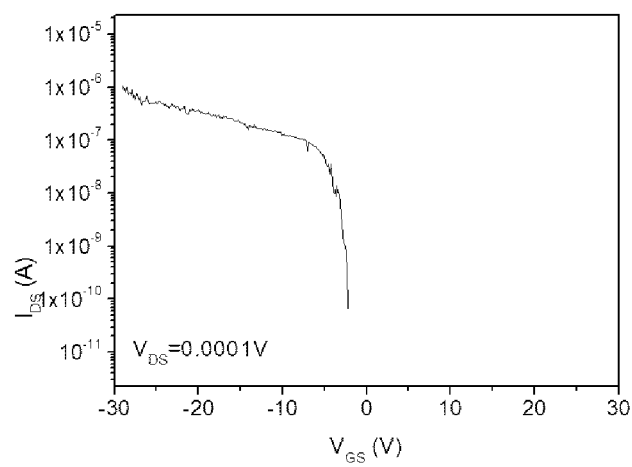
FIG. 11 is a graph depicting transfer characteristics of an ambipolar transistor using a single layer of a gate insulating film.
Figure 12:
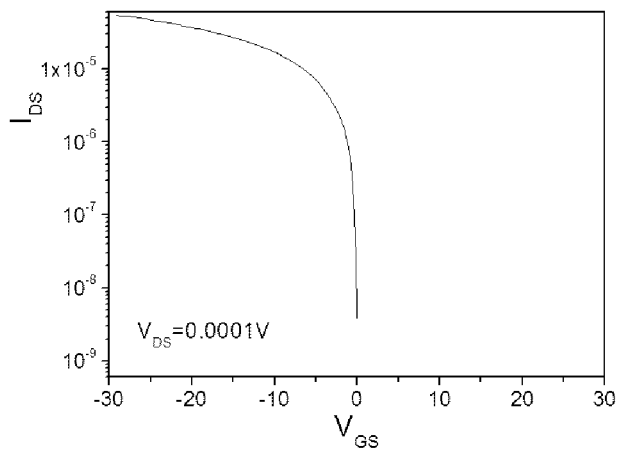
FIG. 12 is a graph depicting transfer characteristics of the series pattern diffusion current transistor according to the present invention.

FIG. 11 is a graph depicting transfer characteristics of an ambipolar transistor using a single layer of a gate insulating film; FIG. 12 is a graph depicting transfer characteristics of the series pattern diffusion current transistor according to the present invention; and FIG. 13 is a graph depicting the transfer characteristics of the series pattern diffusion current transistor of FIG. 12 on a log scale.

As shown in FIG. 11, it can be seen that a very low current of about $-10^{-6}$ A flows through the ambipolar transistor using the single layer of the gate insulating film. Conversely, as shown in FIG. 12, it can be seen that the current value is increased to $-10^{-4}$ A due to the influence of a series pattern in the series pattern diffusion current transistor.

In addition, linear characteristics of $I_{DS}$-$V_{Gs}$ transfer characteristics of the series connection-type transistor according to the first embodiment exhibit ambipolarity. That is, when a gate voltage is redirected from the negative direction to the positive direction, a drain current is redirected from the positive direction to the negative direction. Since the gate insulating film 100 can induce tunneling of a diffusion current due to spontaneous polarization of an amorphous dielectric, when a negative bias is applied to the gate 203, a (+) source-drain current flows through the thin film transistor, whereas when a positive bias is applied to the gate, a (−) source-drain current flows through the transistor.

Figure 13:
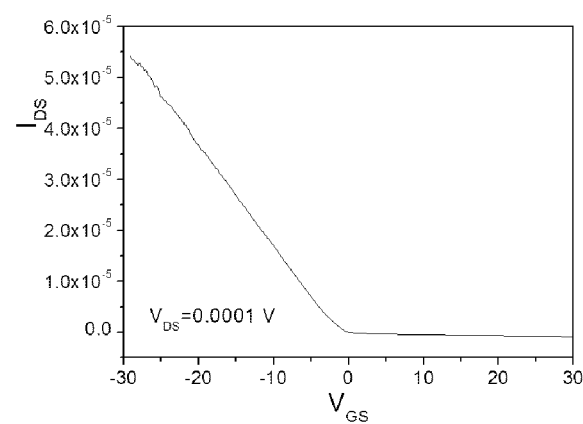
FIG. 13 is a graph depicting the transfer characteristics of the series pattern diffusion current transistor of FIG. 12 on a log scale.

FIG. 13 is a graph depicting mobility and on/off characteristics acquired by converting the IDS-VGS transfer characteristics of FIG. 12 into a log scale. As shown in FIG. 13, it can be seen that the stability and mobility of the transfer characteristics increase with decreasing drain voltage.

Referring to FIG. 13, as the drain voltage decreases, tunneling of minority carriers at an interface between a semiconductor and the gate insulating film can be more easily achieved. Preferably, a bias applied to the drain ranges from $10^{-4}$ V to 1 V.

Although some embodiments have been disclosed above, it should be understood that these embodiments are given by way of illustration only, and that various modifications, variations, and alterations can be made without departing from the spirit and scope of the present invention. Therefore, the scope of the present invention should be limited only by the accompanying claims and equivalents thereof.

What is claimed is:

1. An ambipolar transistor comprising:
   a substrate;
   a gate formed on the substrate;
   a gate insulating film formed of an SiOC thin film and disposed on the substrate and the gate; and
   a source portion and a drain portion formed on the gate insulating film and spaced apart from each other,
   wherein the source portion and the drain portion comprise: a main source terminal and a main drain terminal disposed on the gate insulating film at right and left sides of the gate, respectively; and a plurality of source sub-terminals and a plurality of drain sub-terminals alternately arranged between the main source terminal and the main drain terminal, respectively.

2. The ambipolar transistor according to claim 1, wherein the plurality of source sub-terminals and the plurality of drain sub-terminals are alternately arranged to be separated from each other and connected to each other in series between the main source terminal and the main drain terminal.

3. The ambipolar transistor according to claim 1, wherein the gate insulating film has an allowable dielectric constant of 0.1 to 2.5.

4. The ambipolar transistor according to claim 1, wherein the gate insulating film has an allowable leakage current of $10^{-14}$ A to $10^{-10}$ A.

5. The ambipolar transistor according to claim 1, wherein a bias applied to the drain portion ranges from $10^{-4}$ V to 1 V.

6. An ambipolar transistor comprising:
a substrate;
a gate connected to the substrate;
an SiOC insulating film formed on the substrate;
an interlayer electrode formed on the SiOC insulating film;
an SiOC insulating film formed on the interlayer electrode; and
a source portion and a drain portion formed on the SiOC insulating film and spaced apart from each other,
wherein the SiOC insulating film and the interlayer electrode are alternately stacked one above another, and
wherein the source portion and the drain portion comprise: a main source terminal and a main drain terminal disposed at right and left sides of the SiOC insulating film, respectively; and a plurality of source sub-terminals and a plurality of drain sub-terminals arranged between the main source terminal and the main drain terminal, respectively.

7. The ambipolar transistor according to claim 6, wherein the gate is formed in the SiOC insulating film formed on the substrate.

8. The ambipolar transistor according to claim 6, wherein the gate is formed at an edge of the substrate outside the SiOC insulating film.

9. The ambipolar transistor according to claim 6, wherein the gate is formed under the substrate.

10. The ambipolar transistor according to claim 6, wherein the plurality of source sub-terminals and the plurality of drain sub-terminals are alternately arranged to be separated from each other and connected to each other in series between the main source terminal and the main drain terminal.

11. The ambipolar transistor according to claim 6, wherein the gate insulating film has an allowable dielectric constant of 0.1 to 2.5.

12. The ambipolar transistor according to claim 6, wherein the interlayer electrode is formed of any one selected from aluminum (Al), nanowire, graphene, ITO, transparent conductive oxide (TCO), AZO, ZTO, IGZO, ZITO, SiZO, hybrid (composite), and CNT-based transparent electrodes.

13. A leakage current cutoff device using an ambipolar transistor, comprising:
a load connected to a drain terminal;
a power source connected to the load;
a source terminal connected to a negative terminal of the power source; and
a gate,
wherein leakage current is cutoff by diffusion current between the source terminal and the drain terminal, and
the ambipolar transistor comprising the gate electrode, the drain electrode, and the source electrode comprises:
a substrate;
a gate formed on the substrate;
a gate insulating film formed of an SiOC thin film and disposed on the substrate and the gate; and
a source portion and a drain portion formed on the gate insulating film and spaced apart from each other,
wherein the source portion and the drain portion comprise: a main source terminal and a main drain terminal disposed on the gate insulating film at right and left sides of the gate, respectively; and a plurality of source sub-terminals and a plurality of drain sub-terminals arranged between the main source terminal and the main drain terminal, respectively.

14. The leakage current cutoff device according to claim 13, wherein the ambipolar transistor comprises:
a substrate;
a gate connected to the substrate;
an SiOC insulating film formed on the substrate;
an interlayer electrode formed on the SiOC insulating film;
an SiOC insulating film formed on the interlayer electrode; and
a source portion and a drain portion formed on the SiOC insulating film and spaced apart from each other,
wherein the SiOC insulating film and the interlayer electrode are alternately stacked one above another, and
wherein the source portion and the drain portion comprise: a main source terminal and a main drain terminal disposed at right and left sides of the SiOC insulating film, respectively; and a plurality of source sub-terminals and a plurality of drain sub-terminals arranged between the main source terminal and the main drain terminal, respectively.

15. The leakage current cutoff device according to claim 13, wherein the gate is connected to a power source.

16. The leakage current cutoff device according to claim 15, wherein a variable resistor for controlling sensitivity is connected between the gate and the power source.

17. The leakage current cutoff device according to claim 13, wherein a capacitor and a Wheatstone bridge are connected in parallel to the drain terminal.

18. The leakage current cutoff device according to claim 14, wherein the gate is connected to a power source.

19. The leakage current cutoff device according to claim 18, wherein a variable resistor for controlling sensitivity is connected between the gate and the power source.

20. The leakage current cutoff device according to claim 14, wherein a capacitor and a Wheatstone bridge are connected in parallel to the drain terminal.

* * * * *